(12) United States Patent
Fang et al.

(10) Patent No.: US 8,779,468 B2
(45) Date of Patent: Jul. 15, 2014

(54) NITRIDE SEMICONDUCTOR STRUCTURE

(71) Applicant: Industrial Technology Research Institute, Hsinchu (TW)

(72) Inventors: Yen-Hsiang Fang, New Taipei (TW); Chien-Pin Lu, Taoyuan County (TW); Chen-Zi Liao, Nantou County (TW); Rong Xuan, New Taipei (TW); Yi-Keng Fu, Hsinchu County (TW); Chih-Wei Hu, Taoyuan County (TW); Hsun-Chih Liu, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 19 days.

(21) Appl. No.: 13/726,648

(22) Filed: Dec. 26, 2012

(65) Prior Publication Data

US 2014/0124833 A1    May 8, 2014

(30) Foreign Application Priority Data

Nov. 8, 2012 (TW) ................................ 101141675

(51) Int. Cl.
*H01L 21/02* (2006.01)

(52) U.S. Cl.
USPC ........................................................ 257/190

(58) Field of Classification Search
USPC ........................................................ 257/190
See application file for complete search history.

(56) References Cited

U.S. PATENT DOCUMENTS

| | | |
|---|---|---|
| 6,617,060 B2 | 9/2003 | Weeks, Jr. et al. |
| 7,323,764 B2 * | 1/2008 | Wallis ............................ 257/613 |
| 7,361,576 B2 * | 4/2008 | Imer et al. ...................... 438/479 |
| 7,910,937 B2 | 3/2011 | Chen et al. |
| 2002/0094003 A1 | 7/2002 | Bour et al. |
| 2004/0099871 A1 | 5/2004 | Izumi et al. |
| 2006/0145186 A1 | 7/2006 | Wallis |
| 2006/0191474 A1 | 8/2006 | Chen et al. |
| 2009/0243043 A1 * | 10/2009 | Wang ............................. 257/615 |

FOREIGN PATENT DOCUMENTS

| | | |
|---|---|---|
| TW | I240430 | 9/2005 |
| TW | 200907124 | 2/2009 |

OTHER PUBLICATIONS

Cheong et al., "Direct heteroepitaxial lateral overgrowth of GaN on stripe-patterned sapphire substrates with very thin SiO2 masks", physica status solidi (b), Sep. 2004, vol. 241, p. 2763-p. 2766.

(Continued)

*Primary Examiner* — Thao P Le
(74) *Attorney, Agent, or Firm* — Jianq Chyun IP Office (57) ABSTRACT

A nitride semiconductor structure including a silicon substrate, a nucleation layer, a discontinuous defect blocking layer, a buffer layer and a nitride semiconductor layer is provided. The nucleation layer disposed on the silicon substrate, wherein the nucleation layer has a defect density d1. A portion of the nucleation layer is covered by the discontinuous defect blocking layer. The buffer layer is disposed on the discontinuous defect blocking layer and a portion of the nucleation layer that is not covered by the discontinuous defect blocking layer. The nitride semiconductor layer is disposed on the buffer layer. A ratio of a defect density d2 of the nitride semiconductor layer to the defect density d1 of the nucleation layer is less than or equal to about 0.5, at a location where about 1 micrometer above the interface between the nitride semiconductor layer and the buffer layer.

17 Claims, 8 Drawing Sheets

(56) References Cited

OTHER PUBLICATIONS

Haeberlen et al., "Dislocation reduction in MOVPE grown GaN layers on (111)Si using SiNx and AlGaN layers", 16th International Conference on Microscopy of Semiconducting Materials, Mar. 2009, p. 1-p. 4.

Zhu et al., "Efficiency measurement of GaN-based quantum well and lightemitting diode structures grown on silicon substrates", Journal of Applied Physics, Jan. 2011, vol. 109, p. 014502-1-p. 014502-6.

Hikosaka et al., "Fabrication and properties of semi-polar (1-101) and (11-22) InGaN/GaN light emitting diodes on patterned Si substrates", physica status solidi (c), Apr. 2008, vol. 5, p2234-p2237.

Zhu et al., "GaN-based LEDs grown on 6-inch diameter Si (111) substrates by MOVPE", Proc. of SPIE, Feb. 2009, vol. 7231, p. 723118-1-p. 723118-11.

Wang et al., "Trenched epitaxial lateral overgrowth of fast coalesced a-plane GaN with low dislocation density", Applied Physics Letters, Dec. 2006, vol. 89, p. 251109-1 — p. 251109-3.

\* cited by examiner

NITRIDE SEMICONDUCTOR STRUCTURE

CROSS-REFERENCE TO RELATED APPLICATION

This application claims the priority benefit of Taiwan application serial no. 101141675, filed on Nov. 8, 2012. The entirety of the above-mentioned patent application is hereby incorporated by reference herein and made a part of this specification.

TECHNICAL FIELD

The disclosure relates to a nitride semiconductor structure, and more particularly, to a nitride semiconductor structure on a silicon substrate.

BACKGROUND

Currently, the cost of nitride light emitting diodes is much higher than other illuminating devices, and sapphire substrates that are used for growth of nitride have shortcomings such as poor thermal conductivity which seriously affects their lifespan. Therefore, replacing the current sapphire substrate with a lower-cost and high thermal conductive substrate is the goal that major companies have been working on. Since silicon substrates have properties such as high thermal conductivity, high electrical conductivity, ability to be cut easily and low cost, the major companies have been competing to develop a light emitting diode based on a silicon substrate in recent years.

However, nitride semiconductor structures fabricated on silicon substrates have low production yields, so that the cost of the devices is difficult to decrease significantly. The main reason for affecting the yield of nitride semiconductor structures is coefficient of thermal expansion (CTE) mismatch and lattice mismatch between the nitride semiconductor layer and the silicon substrate, where the mismatch of lattice constant may cause the nitride semiconductor structures to crack easily and also cause the electric leakage, such that the illuminating efficiency may be affected.

Figure 1:
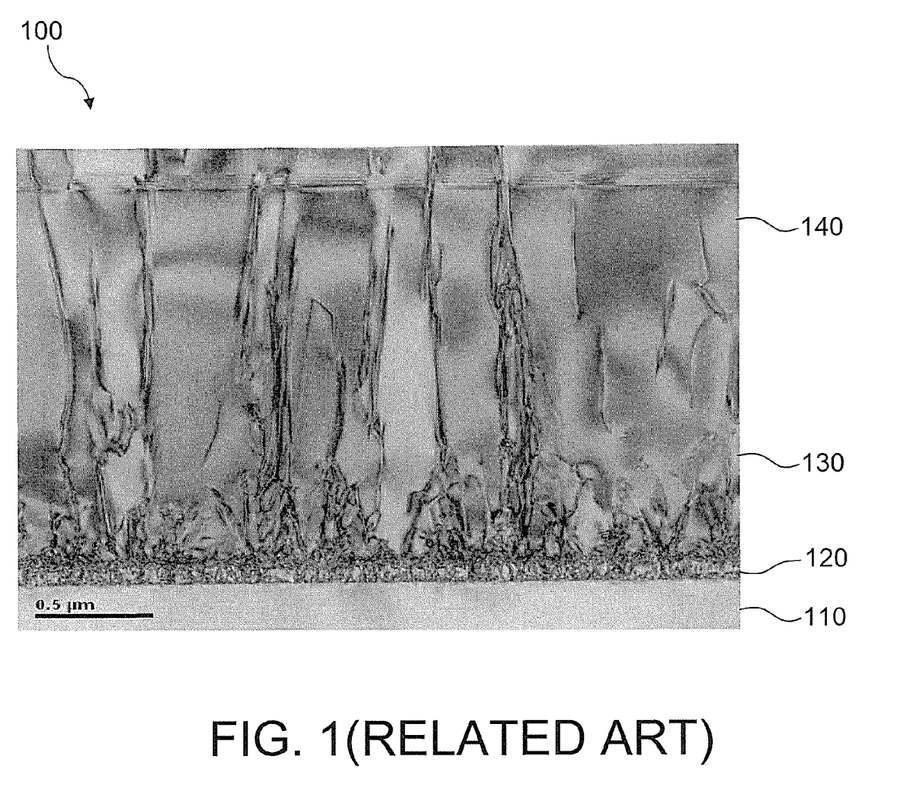
FIG. 1 is a transmission electron microscope (TEM) image of a conventional nitride semiconductor structure.

When research and development (R&D) institutions and major companies manufacture the nitride semiconductor structure over a silicon substrate, a nucleation layer must be grown on the silicon substrate firstly, which is to prevent elements such as gallium (Ga) in the nitride semiconductor layer easily reacting with silicon to form compounds in the subsequent growth of the nitride semiconductor layer, such that the amorphous or non-monocrystalline may not be generated and the illuminating intensity of the light emitting diode may not be affected. FIG. 1 is a transmission electron microscope (TEM) image of a conventional nitride semiconductor structure. Referring to FIG. 1, the conventional nitride semiconductor structure 100 includes a silicon substrate 110, a nucleation layer 120, a buffer layer 130 and a nitride semiconductor layer 140. Since the lattice mismatch between the silicon substrate 110 and the nucleation layer 120 is considerably large (for instance, the lattice mismatch between the silicon substrate 110 and the nucleation layer 120 is greater than 17%, if the nucleation layer 120 including aluminum nitride (AlN) is exemplified), a large amount of defects may be generated on the interface between the silicon substrate 110 and the nucleation layer 120, as shown in FIG. 1. Although the nitride semiconductor layer 140 having a certain thickness is formed by the subsequent growth, it is difficult to prevent the generation of defects, so that the nitride semiconductor layer 140 has a relatively high defects density.

Figure 2A:
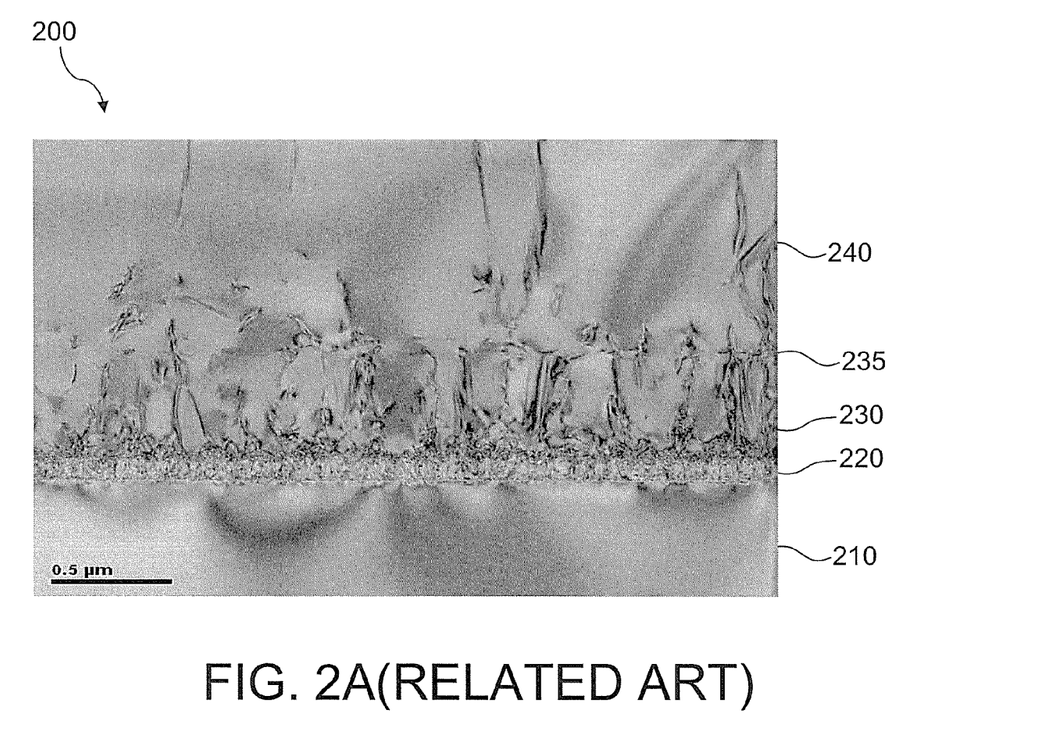
FIG. 2A is a transmission electron microscope image of another conventional nitride semiconductor structure.

FIG. 2A is a transmission electron microscope (TEM) image of a conventional nitride semiconductor structure. Referring to FIG. 2A, the conventional nitride semiconductor structure 200 includes a silicon substrate 210, a nucleation layer 220, a buffer layer 230, a defect blocking layer 235 and a nitride semiconductor layer 240. In the conventional nitride semiconductor structure 200, the defect blocking layer 235 is formed on the buffer layer 230 to block the defects. In addition, the defect blocking layer 235 may reduce the lattice defects occurred in the nitride semiconductor layer 240 during the epitaxial growth process, and may release stress. However, due to most defects are formed at the interface between the silicon substrate 210 and the nucleation layer 220, the defect amount blocked by the defect blocking layer 235 is limited since the defect blocking layer 235 is formed on the buffer layer 230. In addition, the defect blocking layer 235 is usually an amorphous layer, and the subsequently formed nitride semiconductor layer 240 grows on the defect blocking layer 235 and is required to have a flat top surface. In other words, coalescence of the nitride semiconductor layer 240 is necessary. Nevertheless, the growth of the defect blocking layer 235 may cause stress, so that the nitride semiconductor structure 200 may easily crack while cooling. Therefore, the flat top surface of the nitride semiconductor layer 240 must be formed less than a certain thickness, so as to reduce the stress.

Figure 2B:
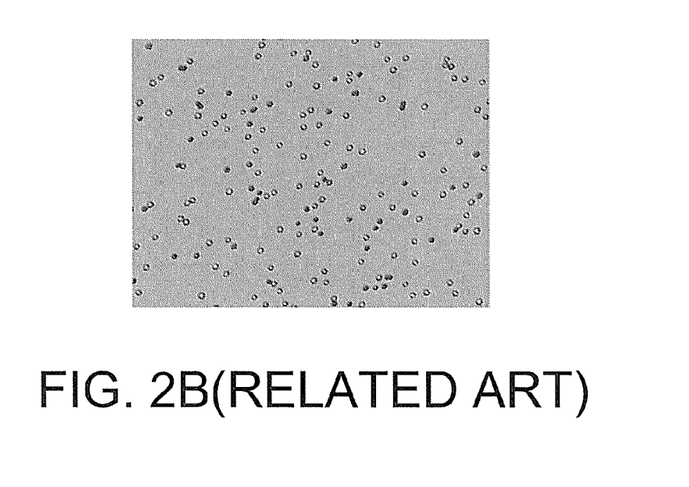
FIG. 2B is an enlarged view of the nitride semiconductor structure in FIG. 2A being enlarged 20 times by an optical microscopy (OM).

FIG. 2B is an enlarged view of the nitride semiconductor structure in FIG. 2A being enlarged 20 times by the optical microscopy (OM). Referring to FIG. 2B, there are a plurality of voids in the nitride semiconductor layer 240. This is because the nitride semiconductor layer 240 only grows on the defect blocking layer 235 to have the certain thickness for reducing the stress. However, the thickness of the nitride semiconductor layer 240 is insufficient, so that coalescence of the nitride semiconductor layer 240 is difficult to be achieved.

SUMMARY

Accordingly, the disclosure is directed to a nitride semiconductor structure, which may reduce the defect density of a nitride semiconductor layer effectively, where coalescence of the nitride semiconductor layer may easily be achieved.

One of exemplary embodiments provides a nitride semiconductor structure including a silicon substrate, a nucleation layer, a discontinuous defect blocking layer, a buffer layer and a nitride semiconductor layer. The nucleation layer is disposed on the silicon substrate, wherein a defect density of the nucleation layer is d1. A portion of the nucleation layer is covered by the discontinuous defect blocking layer. The buffer layer is disposed on the discontinuous defect blocking layer and a portion area of the nucleation layer that is not covered by the discontinuous defect blocking layer. The nitride semiconductor layer is disposed on the buffer layer. At a location where about 1 micrometer above an interface between the nitride semiconductor layer and the buffer layer, a ratio of the defect density d2 of the nitride semiconductor layer to the defect density d1 of the nucleation layer is less than or equal to about 0.5.

One of exemplary embodiments further provides a nitride semiconductor structure including a silicon substrate, a nucleation layer, a discontinuous defect blocking layer, a buffer layer and a nitride semiconductor layer. The nucleation layer is disposed on the silicon substrate. A portion of the nucleation layer is covered by the discontinuous defect blocking layer. The buffer layer is disposed on the discontinuous defect blocking layer and a portion of the nucleation layer that is not covered by the discontinuous defect blocking layer. The nitride semiconductor layer is disposed on the buffer layer. At a location where about 1 micrometer above an interface between the nitride semiconductor layer and the buffer layer, a Raman shift of the nitride semiconductor layer is about 0.5 cm$^{-1}$.

In order to make the disclosure comprehensible, several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF THE EMBODIMENTS

Figure 3:
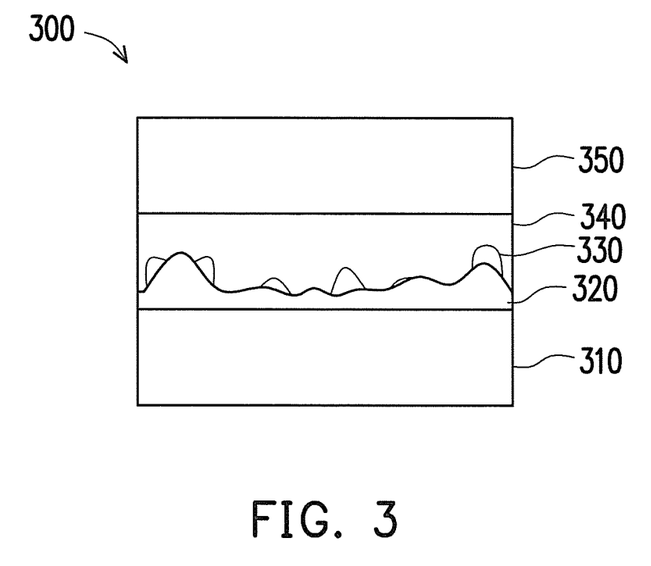
FIG. 3 is a schematic diagram of a nitride semiconductor structure according to an embodiment of the disclosure.

FIG. 3 is a schematic diagram of a nitride semiconductor structure according to an embodiment of the disclosure. Referring to FIG. 3, the nitride semiconductor structure 300 of the embodiment includes a silicon substrate 310, a nucleation layer 320, a discontinuous defect blocking layer 330, a buffer layer 340 and a nitride semiconductor layer 350. In the embodiment, the silicon substrate 310 is a single crystal structure. The nucleation layer 320 is disposed on the silicon substrate 310, and a defect density of the nucleation layer 320 is d1. In the embodiment, a range for the defect density d1 of the nucleation layer 320 is between about $10^{10}$ cm$^{-2}$ and about $10^{12}$ cm$^{-2}$. A portion of the nucleation layer 320 is covered by the discontinuous defect blocking layer 330. The buffer layer 340 is disposed on the discontinuous defect blocking layer 330 and a portion of the nucleation layer 320 uncovered by the discontinuous defect blocking layer 330. The nitride semiconductor layer 350 is the mono-crystalline, for example. The nitride semiconductor layer 350 is disposed on the buffer layer 340.

In the embodiment, the nucleation layer 320, the discontinuous defect blocking layer 330, the buffer layer 340 and the nitride semiconductor layer 350 are deposited on the silicon substrate 310 by a metal organic chemical vapor deposition (MOCVD). However, the fabrication process of the nucleation layer 320, the discontinuous defect blocking layer 330, the buffer layer 340 and the nitride semiconductor layer 350 is not limited to the above-mentioned MOCVD process, other suitable processes may be adapted in this disclosure.

Figure 4A:
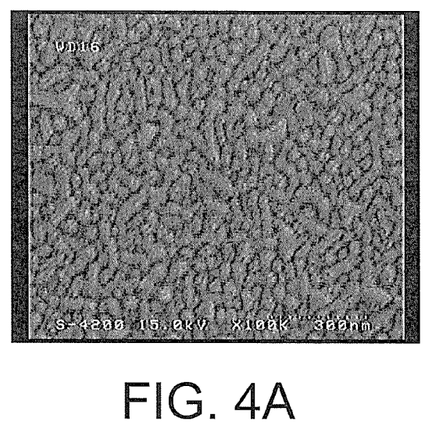
FIG. 4A through FIG. 4F are scanning electron microscope (SEM) images of a nucleation layer after grown on a silicon substrate under temperatures of 770° C., 870° C., 920° C., 970° C., 1050° C. and 1200° C., respectively.
Figure 4B:
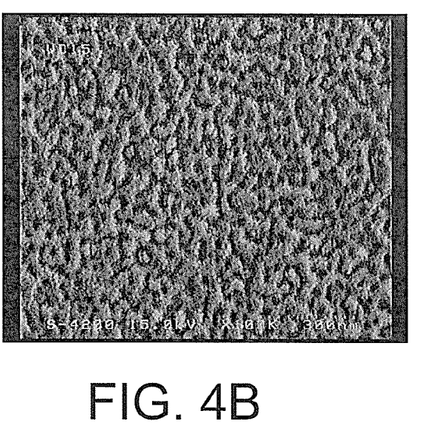
Figure 4C:
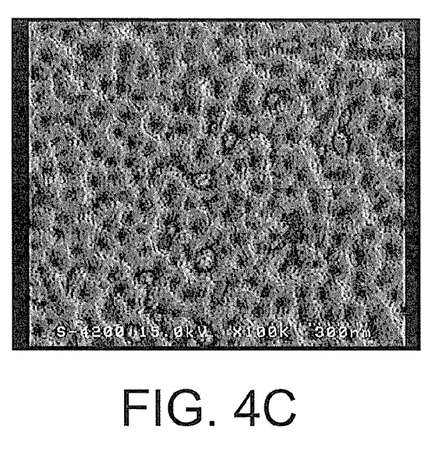
Figure 4D:
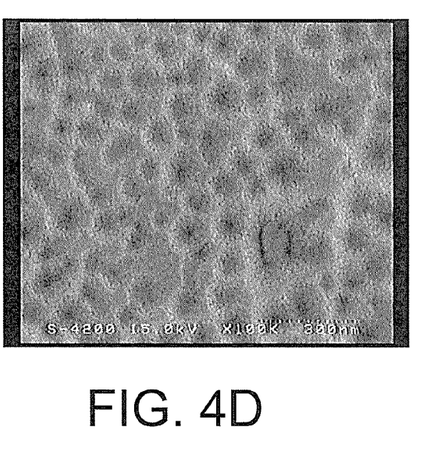
Figure 4E:
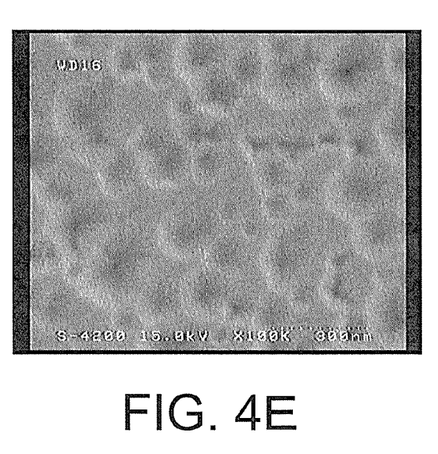
Figure 4F:
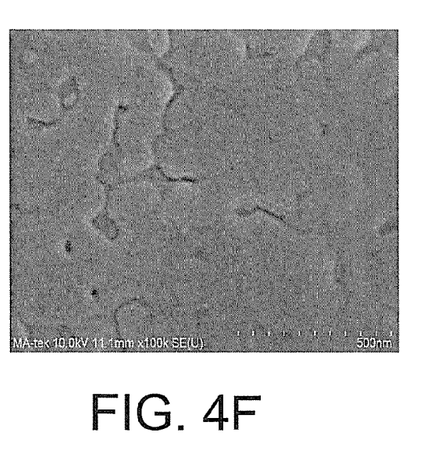

FIG. 4A through FIG. 4F are scanning electron microscope (SEM) images of a nucleation layer after grown on a silicon substrate under temperatures of 770° C., 870° C., 920° C., 970° C., 1050° C. and 1200° C., respectively. Firstly, referring to FIG. 4A through FIG. 4E, a three dimensional structures may be appeared on the surface of the nucleation layer 320 when the nucleation layer 320 grows under the temperature of 1100° C., and such three dimensional structure causes coalescence of the nitride semiconductor layer difficult to be achieved subsequently. Therefore, in the present embodiment, the growing temperature of the nucleation layer 320 is increased to 1200° C. (high temperature process), and the surface of the nucleation layer 320 having better evenness is shown in FIG. 4F. In FIG. 4F, the 2D-like structures are appeared on the surface of the nucleation layer 320. Nevertheless, the surface of the nucleation layer 320 is still not even, as shown in FIG. 3.

Additionally, in the present embodiment, the discontinuous defect blocking layer 330 may be disposed on a portion of the nucleation layer 320, with different thicknesses. The discontinuous defect blocking layer 330 is capable of blocking the defects formed on an interface between the silicon substrate 310 and the nucleation layer 320. In the embodiment, the material of the discontinuous defect blocking layer 330 includes silicon nitride (SiN), but the material of the discontinuous defect blocking layer 330 is not limited thereto. Moreover, the discontinuous defect blocking layer 330 is a nano-porous structure, where a density of the nano-porous structure is about $3.5 \times 10^{13}$/cm$^2$ to about $8.4 \times 10^{13}$/cm$^2$. However, the density and structure of the discontinuous defect blocking layer 330 are not limited to the above-mentioned.

In the embodiment, at a location where about 1 micrometer above the interface between the nitride semiconductor layer 350 and the buffer layer 340, a defect density range for the defect density d2 of the nitride semiconductor layer 350 is between about $10^9$ cm$^{-2}$ and about $5 \times 10^9$ cm$^{-2}$. Therefore, at the location where about 1 micrometer above the interface between the nitride semiconductor layer 350 and the buffer layer 340, a ratio of the defect density d2 of the nitride semiconductor layer 350 to the defect density d1 of the nucleation layer 320 is less than or equal to about 0.5, preferably not exceed 0.001. In other words, through the discontinuous defect blocking layer 330 grown on the nucleation layer 320, the defects formed between the silicon substrate 310 and the nucleation layer 320 may be blocked effectively below the discontinuous defect blocking layer 330, thereby decreasing the defect density of the nitride semiconductor layer 350 significantly.

Figure 5:
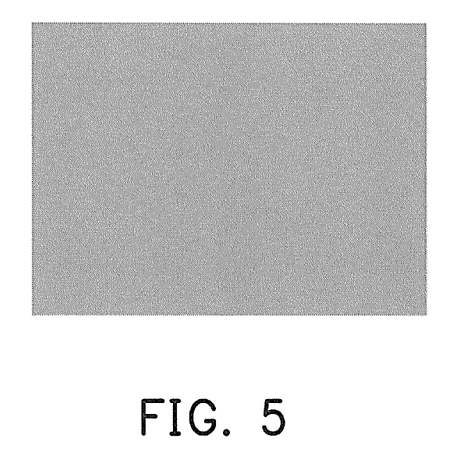
FIG. 5 is an enlarged view of the nitride semiconductor structure in FIG. 3 being enlarged 20 times by an optical microscopy (OM).

FIG. 5 is an enlarged view of the nitride semiconductor structure in FIG. 3 being enlarged 20 times by an optical microscopy (OM). Referring to FIG. 2B and FIG. 5, the thickness of the nitride semiconductor layer 240 is limited to a certain range in order to reduce the stress being created, so that coalescence of the nitride semiconductor layer 240 is difficult to be achieved, and the surface of the nitride semiconductor layer 240 has a plurality of voids, as show in FIG. 2B. However, as shown in FIG. 5, it can be seen that the nitride semiconductor layer 350 is formed without voids almost. This is because that the buffer layer 340 is grown after the growth of the discontinuous defect blocking layer 330, the voids on the nucleation layer 320 and the discontinuous defect blocking layer 330 may be filled up by the buffer layer 340 with a sufficient thickness, and afterwards, the nitride semiconductor layer 350 is grown on the buffer layer 340, and thus the coalescence issue of the nitride semiconductor layer 350 having a thickness less than the certain thickness range may be solved.

A material of the nucleation layer 320 is, for example, aluminum nitride (AlN), and a material of the buffer layer 340 is, for example, grading aluminum gallium nitride (AlGaN). The materials of the nucleation layer 320 and the buffer layer 340 are not limited thereto. Additionally, in the embodiment, the variation rate of lattice constant divided by the thickness of the buffer layer 340 is between about 5.08 (%/μm) and about 1.27 (%/μm).

In the embodiment, the thickness range for the nucleation layer 320 is between about 10 nanometers and about 500 nanometers. The thickness range for the discontinuous defect blocking layer 330 is between about 10 nanometers and about 100 nanometers. The thickness range for the buffer layer 340 is between about 0.5 micrometers and about 3 micrometers. The thickness range for the nitride semiconductor layer 350 is between about 1000 nanometers and about 2000 nanometers. In the nitride semiconductor structure 300 of the embodiment, the thickness of the nucleation layer 320 is reduced due to formation of the discontinuous defect blocking layer 330, so as to reduce the stress within the nitride semiconductor structure 300 and decrease the probability of cracks occurred at a cooling stage after the fabrication of the nitride semiconductor structure 300. Moreover, since the buffer layer 340 is capable of filling up the voids on the nucleation layer 320 and the discontinuous defect blocking layer 330, the thickness of the nitride semiconductor layer 350 that is grown on the buffer layer 340, subsequently may be reduced, and thus the coalescence issue of the nitride semiconductor layer 350 may be solved effectively.

Figure 2C:
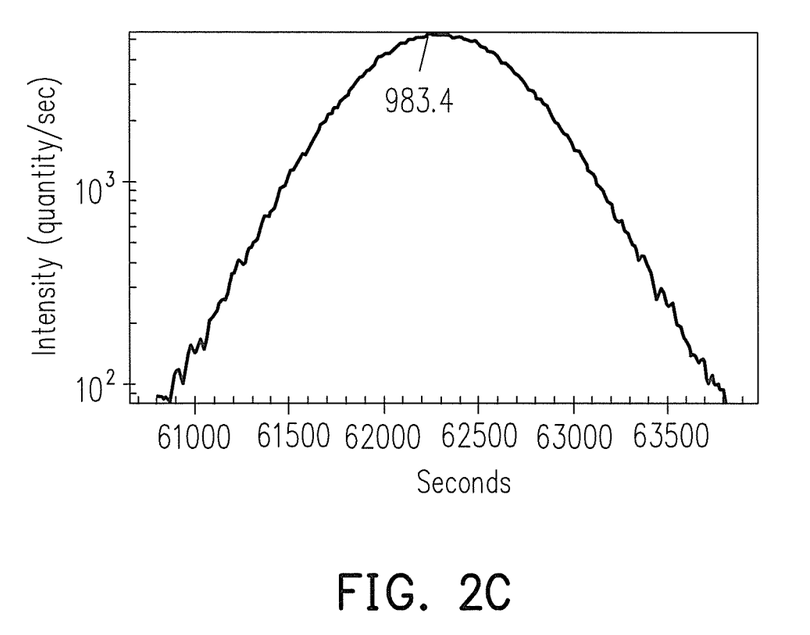
FIG. 2C is a schematic diagram of an X-ray diffraction (XRD) analysis of the nitride semiconductor structure in FIG. 2A.
Figure 6:
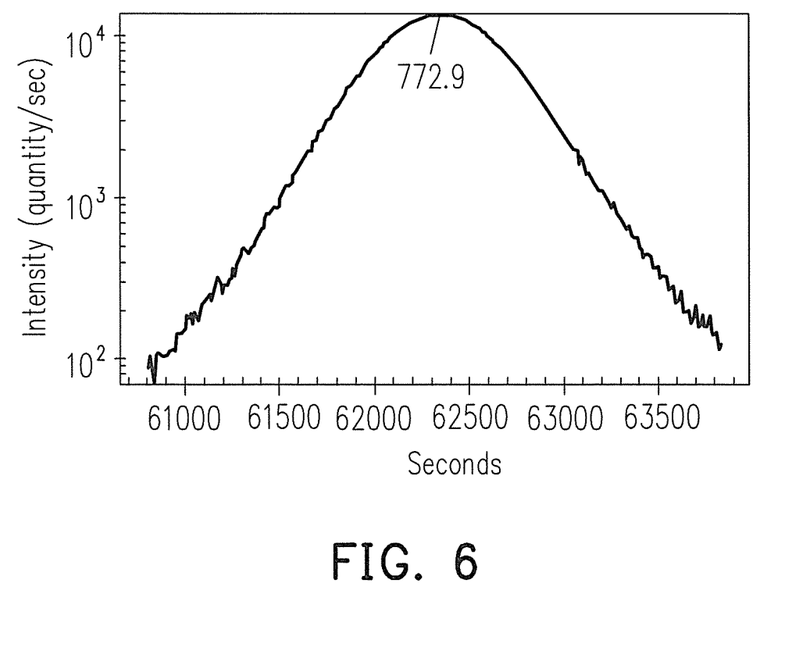
FIG. 6 is a schematic diagram of an X-ray diffraction (XRD) analysis of the nitride semiconductor structure in FIG. 3.

FIG. 6 is a schematic diagram of an X-ray diffraction (XRD) analysis of the nitride semiconductor structure in FIG. 3. Referring to FIG. 6, when the defect density of the nitride semiconductor layer 350 is about $5 \times 10^9/cm^2$, the X-ray diffraction analysis of the nitride semiconductor structure 300 in the embodiment is 772 arcsec. FIG. 2C is a schematic diagram of an X-ray diffraction (XRD) analysis of the nitride semiconductor structure in FIG. 2A. Referring to FIG. 2C, when the defect density of the nitride semiconductor layer 240 is about $2 \times 10^{10}/cm^2$, the X-ray diffraction analysis of the nitride semiconductor structure 200 in the embodiment is 998 arcsec. It can be seen from the comparison of FIG. 2C and FIG. 6 that, the defect density of the nitride semiconductor layer 350 in the nitride semiconductor structure 300 of the embodiment has already been reduced significantly in comparison to the conventional nitride semiconductor structure 200.

Figure 2D:
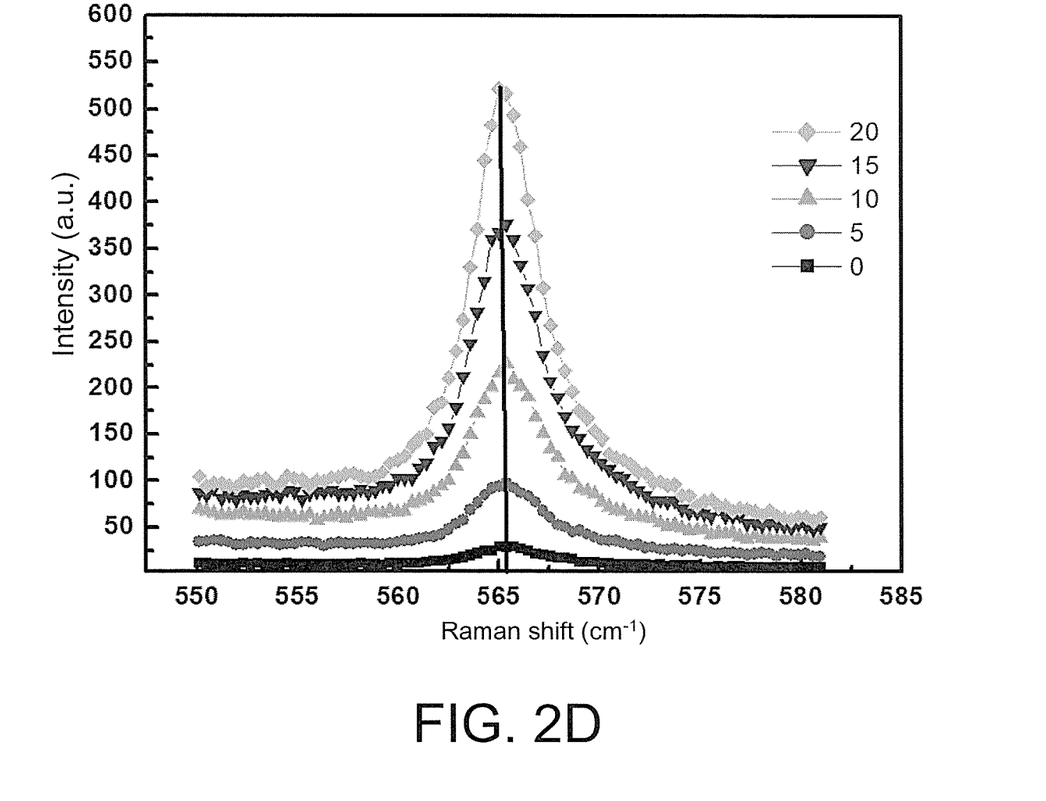
FIG. 2D is a schematic diagram of a Raman spectrum of the nitride semiconductor structure in FIG. 2A.
Figure 7:
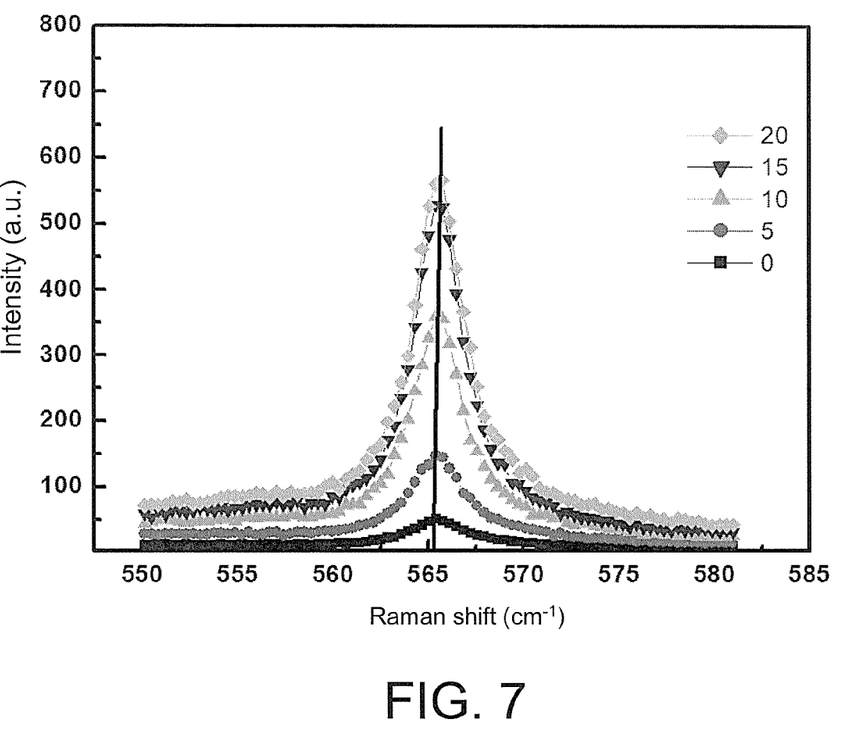
FIG. 7 is a schematic diagram of a Raman spectrum of the nitride semiconductor structure in FIG. 3.

FIG. 7 is a schematic diagram of a Raman spectrum of the nitride semiconductor structure in FIG. 3. Referring to FIG. 7, in the nitride semiconductor structure 300 of the embodiment, at a location where about 1 micrometer above an interface between the nitride semiconductor layer 350 and the buffer layer 340 (that is, the direction towards the surface of the nitride semiconductor layer 350), the Raman shift of the nitride semiconductor layer 350 is about 0.5 $cm^{-1}$. FIG. 2D is a schematic diagram of a Raman spectrum of the nitride semiconductor structure in FIG. 2A. Referring to FIG. 2D, in the conventional nitride semiconductor structure 200, at a location where about 1 micrometer above an interface between the nitride semiconductor layer 240 and the buffer layer 230, the Raman shift of the nitride semiconductor layer 240 is about −0.3 $cm^{-1}$.

The relations of the stress between two stacked layers may be observed in the Raman spectrum, wherein a value of the horizontal axis in the figure becomes smaller that indicates the tensile stress, contrarily, the value of the horizontal axis in the figure becomes greater that indicates the compressive stress. Through the results of Raman shifts displayed in the Raman spectrum of FIG. 2D and FIG. 7, it can be seen that the stress variation for the nitride semiconductor structure 300 of the embodiment at the location where about 1 micrometer above the interface between the nitride semiconductor layer 350 and the buffer layer 340 and the conventional nitride semiconductor structure 200 at the location where about 1 micrometer above the interface between the nitride semiconductor layer 240 and the buffer layer 230. FIG. 2D is the result of the Raman shifts without including the discontinuous defect blocking layer 330, and the result shows that the nitride semiconductor structure 300 suffers tensile stress; and FIG. 7 is the result of the Raman shifts without including the discontinuous defect blocking layer 330, and the result shows that the nitride semiconductor structure 300 suffers compressive stress. According to this paragraph described, the discontinuous defect blocking layer 330 is capable of significantly reducing the tensile stress caused by the coefficients of thermal expansion mismatch (CTE mismatch) between the silicon substrate 310 and the nitride semiconductor layer 350.

In the nitride semiconductor structure 300 of the embodiment, the nucleation layer may be grown at a high temperature, such that 2D-like structures are appeared on the surface of the nucleation layer 320. The discontinuous defect blocking layer 330 is grown on the nucleation layer 320 so as to block the defects generated on the interface between the silicon substrate 310 and the nucleation layer 320. Then, low pressure epitaxial processes are performed to grow semiconductor layers evenly. Additionally, since the lattice constant of the nucleation layer 320 is smaller than the lattice constant of the silicon substrate 310, the mismatch of lattice constants between the silicon substrate 310 and the nucleation layer 320 may cause the stress being created, moreover, the amorphous discontinuous defect blocking layer 330 may also cause the stress being created. In the embodiment, a portion of thickness of the nucleation layer 320 is replaced by the discontinuous defect blocking layer 330, so as to reduce the stress within the nitride semiconductor structure 300 and decrease the probability of cracks being occurred in the nitride semiconductor structure 300 after cooling.

According to the aforementioned embodiments, the discontinuous defect blocking layer is grown on the nucleation layer in the nitride semiconductor structure of the disclosure, so that most of the defects on the nucleation layer may be blocked by the discontinuous defect blocking layer, so as to reduce the defect density of the nitride semiconductor layer. In addition, the voids on the discontinuous defect blocking layer and the nucleation layer are filled up by the buffer layer in the nitride semiconductor structure of the disclosure, and thus the issue that coalescence of the nitride semiconductor layer is unable to be achieved may be prevented effectively. Furthermore, the nitride semiconductor structure of the disclosure may be applied to light emitting diodes etc. so as to obtain a product with high luminosity and high quality.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A nitride semiconductor structure, comprising:
   a silicon substrate;
   a nucleation layer, disposed on the silicon substrate, wherein a defect density of the nucleation layer is d1;
   a discontinuous defect blocking layer, covering a portion of the nucleation layer;
   a buffer layer, disposed on the discontinuous defect blocking layer and a portion area of the nucleation layer that is not covered by the discontinuous defect blocking layer; and
   a nitride semiconductor layer, disposed on the buffer layer, wherein at a location where about 1 micrometer above an interface between the nitride semiconductor layer and the buffer layer, a ratio of a defect density d2 of the nitride semiconductor layer to the defect density d1 of the nucleation layer is less than or equal to about 0.5.

2. The nitride semiconductor structure as claimed in claim 1, wherein a range for the defect density d1 of the nucleation layer is between about $10^{10}$ cm$^{-2}$ and about $10^{12}$ cm$^{-2}$.

3. The nitride semiconductor structure as claimed in claim 1, wherein at the location where about 1 micrometer above the interface between the nitride semiconductor layer and the buffer layer, a defect density range for the defect density d2 of the nitride semiconductor layer is between about $10^9$ cm$^{-2}$ and about $5 \times 10^9$ cm$^{-2}$.

4. The nitride semiconductor structure as claimed in claim 1, wherein the discontinuous defect blocking layer comprises silicon nitride.

5. The nitride semiconductor structure as claimed in claim 1, wherein the discontinuous defect blocking layer is a nano-porous structure, and a density of the nano-porous structure is about between about $3.5 \times 10^{13}$/cm$^2$ and about $8.4 \times 10^{13}$/cm$^2$.

6. The nitride semiconductor structure as claimed in claim 1, wherein at the location where about 1 micrometer above the interface between the nitride semiconductor layer and the buffer layer, a Raman shift of the nitride semiconductor layer is about 0.5 cm$^{-1}$.

7. The nitride semiconductor structure as claimed in claim 1, wherein a thickness range for the nucleation layer is between about 10 nanometers and about 500 nanometers.

8. The nitride semiconductor structure as claimed in claim 1, wherein a thickness range for the discontinuous defect blocking layer is between about 10 nanometers and about 100 nanometers.

9. The nitride semiconductor structure as claimed in claim 1, wherein at the location where about 1 micrometer above the interface between the nitride semiconductor layer and the buffer layer, the ratio of the defect density d2 of the nitride semiconductor layer to the defect density d1 of the nucleation layer is less than or equal to about 0.001.

10. The nitride semiconductor structure as claimed in claim 1, wherein a thickness range for the nitride semiconductor layer is between about 1000 nanometers and about 2000 nanometers.

11. A nitride semiconductor structure, comprising:
    a silicon substrate;
    a nucleation layer, disposed on the silicon substrate;
    a discontinuous defect blocking layer, covering a portion of the nucleation layer;
    a buffer layer, disposed on the discontinuous defect blocking layer and another portion of the nucleation layer that is not covered by the discontinuous defect blocking layer; and
    a nitride semiconductor layer, disposed on the buffer layer, wherein at a location where about 1 micrometer above an interface between the nitride semiconductor layer and the buffer layer, a Raman shift of the nitride semiconductor layer is about 0.5 cm$^{-1}$.

12. The nitride semiconductor structure as claimed in claim 11, wherein the discontinuous defect blocking layer comprises silicon nitride.

13. The nitride semiconductor structure as claimed in claim 11, wherein the discontinuous defect blocking layer is a nano-porous structure, and a density of the nano-porous structure is about between about $3.5 \times 10^{13}$/cm$^2$ and about $8.4 \times 10^{13}$/cm$^2$.

14. The nitride semiconductor structure as claimed in claim 11, wherein a thickness of the nucleation layer is between about 10 nanometers and about 500 nanometers.

15. The nitride semiconductor structure as claimed in claim 11, wherein a thickness of the discontinuous defect blocking layer is between about 10 nanometers and about 100 nanometers.

16. The nitride semiconductor structure as claimed in claim 11, wherein a thickness range for the nitride semiconductor layer is between about 1000 nanometers and about 2000 nanometers.

17. The nitride semiconductor structure as claimed in claim 11, wherein at the location where about 1 micrometer above the interface between the nitride semiconductor layer and the buffer layer, a ratio of a defect density d2 of the nitride semiconductor layer to the defect density d1 of the nucleation layer is less than or equal to about 0.001.

\* \* \* \* \*